US012772563B2

(12) United States Patent
Choi

(10) Patent No.: US 12,772,563 B2
(45) Date of Patent: Oct. 20, 2026

(54) SEMICONDUCTOR DEVICE INCLUDING FIRST AND SECOND MIDDLE-VOLTAGE ELEMENTS, DISPLAY DRIVING DEVICE INCLUDING THE SAME, AND METHOD FOR MANUFACTURING THE SEMICONDUCTOR DEVICE

(71) Applicant: LX SEMICON CO., LTD., Daejeon (KR)

(72) Inventor: Kee Joon Choi, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 386 days.

(21) Appl. No.: 18/240,711

(22) Filed: Aug. 31, 2023

(65) Prior Publication Data

US 2024/0072069 A1 Feb. 29, 2024

(30) Foreign Application Priority Data

Aug. 31, 2022 (KR) ........................ 10-2022-0109914
Jul. 10, 2023 (KR) ........................ 10-2023-0088929

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0231* (2025.01); *H10D 86/431* (2025.01); *H10D 86/441* (2025.01)

(58) Field of Classification Search
CPC .. H10D 86/60; H10D 86/0231; H10D 86/431; H10D 86/441
See application file for complete search history.

(56) References Cited

U.S. PATENT DOCUMENTS

2022/0336502 A1* 10/2022 Oh ........................ H10D 62/116

* cited by examiner

*Primary Examiner* — Suberr L Chi
(74) *Attorney, Agent, or Firm* — ROTHWELL, FIGG, ERNST & MANBECK, P.C.

(57) ABSTRACT

Disclosed herein is a semiconductor device including: a first middle-voltage element disposed in a substrate and configured to receive a first level middle-voltage; a second middle-voltage element disposed in the substrate and configured to receive a second level middle-voltage greater than the first level middle-voltage; and a deep well disposed in the substrate so as to surround the first middle-voltage element and the second middle-voltage element, wherein the second middle-voltage element includes: a second-first middle-voltage well doped with a first type dopant; and a second-second middle-voltage well doped with a second type dopant different from the first type dopant.

6 Claims, 7 Drawing Sheets

SEMICONDUCTOR DEVICE INCLUDING FIRST AND SECOND MIDDLE-VOLTAGE ELEMENTS, DISPLAY DRIVING DEVICE INCLUDING THE SAME, AND METHOD FOR MANUFACTURING THE SEMICONDUCTOR DEVICE

This application claims the benefit of Korean Patent Application Nos. 10-2022-0109914, filed on Aug. 31, 2022 and 10-2023-0088929 filed on Jul. 10, 2023, both of which are hereby incorporated by reference in their entirety as if fully set forth herein.

BACKGROUND OF THE DISCLOSURE

Technical Field

The present disclosure relates to a semiconductor device including first and second middle-voltage elements, a display driving device including the same, and a method for manufacturing the semiconductor device.

Background

As the semiconductor industry has grown rapidly, generations of semiconductor devices have been produced such that each of the generations has smaller and more complex circuits than those of a previous generation thereto. In the course of integrated circuit (IC) evolution, a functional density (i.e., the number of interconnected devices per chip area) has generally increased, while a geometric size (i.e., the smallest component (or line) that can be produced using a manufacturing process) has decreased. This scaling down process generally provides benefits by increasing production efficiency and lowering a related cost. However, these benefits have also increased the complexity of semiconductor devices and their manufacturing process.

SUMMARY

A purpose of the present disclosure is to provide a semiconductor device including first and second middle-voltage elements, wherein the second middle-voltage element includes two well areas respectively doped with different types of dopants to implements electrical characteristics, thereby reducing an area size of a circuit including the second middle-voltage element, and to provide a display driving device including the semiconductor device, and a method for manufacturing the semiconductor device.

A semiconductor device according one embodiment of the present disclosure includes a first middle-voltage element disposed in a substrate and configured to receive a first level middle-voltage; a second middle-voltage element disposed in the substrate and configured to receive a second level middle-voltage greater than the first level middle-voltage; and a deep well disposed in the substrate so as to surround the first middle-voltage element and the second middle-voltage element, wherein the second middle-voltage element includes: a second-first middle-voltage well doped with a first type dopant; and a second-second middle-voltage well doped with a second type dopant different from the first type dopant.

In the semiconductor device according to the present disclosure, the display driving device including the same, and a method for manufacturing the semiconductor device, the semiconductor device may include the second middle-voltage element that implements electrical characteristics. Accordingly, the area size of the circuit including the second middle-voltage element is reduced. Furthermore, the second middle-voltage element may be formed using a manufacturing process of the first middle-voltage element. Thus, a manufacturing cost of the semiconductor device including the first and second middle-voltage elements may be reduced.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to describe the principle of the present disclosure. In the drawings.

DETAILED DESCRIPTION

Figure 1:
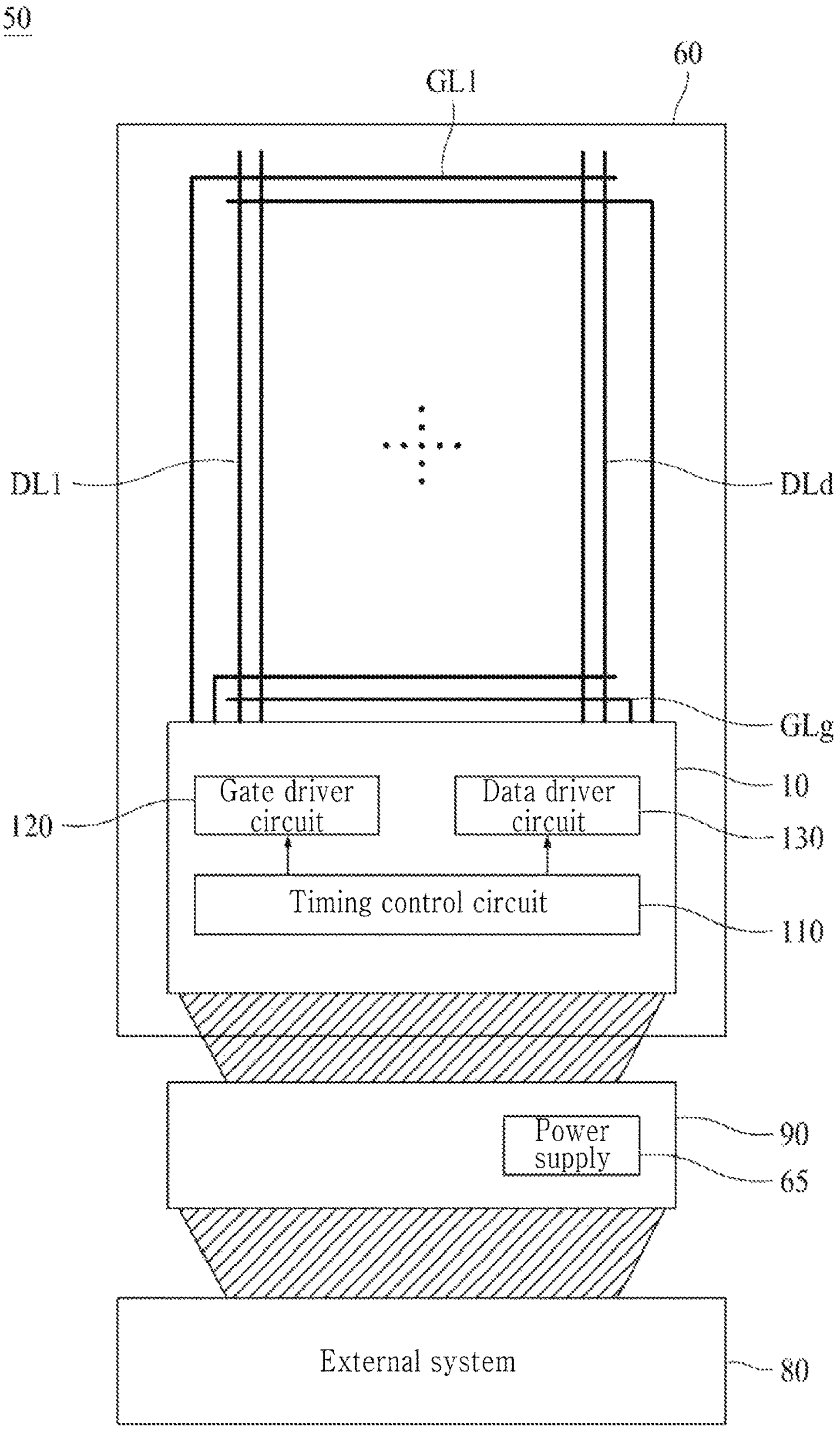
FIG. 1 is a diagram showing a display device to which a display driving device according to an embodiment of the present disclosure is applied.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display device including a display driving device according to an embodiment of the present disclosure will be described in detail with reference to FIG. 1.

FIG. 1 is a diagram showing a display device to which a display driving device according to an embodiment of the present disclosure is applied.

A display device 50 according to the present disclosure includes a display panel 60, a power supply 65, and an external system 80. Moreover, the display device 50 according to the present disclosure includes a display driving device 10.

The display panel 60 may be embodied as an organic light-emitting panel in which an organic light-emitting element is formed, or may be embodied as a liquid crystal panel in which liquid crystal is formed. That is, the display panel 60 applied to the present disclosure may be applied to all types of currently used panels. Therefore, the display device according to the present disclosure may be embodied as an organic light-emitting display device, a liquid crystal display device, or other various types of display devices. However, in following descriptions, for convenience of description, an example in which the display device according to the present disclosure is embodied as a liquid crystal display device will be described.

When the display panel 60 is the liquid crystal panel, on a lower glass substrate of the display panel 60, a plurality of data lines DL1 to DLd, a plurality of gate lines GL1 to GLg intersecting the data lines DL1 to DLd, a plurality of thin film transistors TFT respectively formed at intersections between the plurality of data lines DL1 to DLd and the plurality of gate lines GL1 to GLg, a plurality of pixel electrodes for charging a data voltage to pixels, and a common electrode for driving liquid crystal filled in the liquid crystal layer together with the pixel electrodes may be formed. The pixels are arranged in a matrix form due to the structure in which the plurality of data lines DL1 to DLd and the plurality of gate lines GL1 to GLg intersect each other.

A black matrix BM and a color filter are formed on an upper glass substrate of the display panel 60. The liquid crystal may be filled into between the lower glass substrate and the upper glass substrate.

A liquid crystal mode of the display panel 60 applied to the present disclosure may include not only a TN mode, a VA mode, an IPS mode and an FFS mode, but also any kind of a liquid crystal mode. Moreover, the display device 50 according to the present disclosure may be implemented in any form such as a transmissive liquid crystal display device, a transflective liquid crystal display device, or a reflective liquid crystal display device.

The display panel 60 displays an image in response to a gate signal and a source signal output from the display driving device 10.

The power supply 65 is mounted on the main board 90 and supplies a voltage for driving the display panel 60, the display driving device 10, and the external system 80 thereto. In this regard, in addition to the power supply 65, various circuit elements may be mounted on the main board 90.

The power supply 65 generates a voltage based on a driving voltage of each of circuits included in the display driving device 10 and supplies the voltage to each circuit. In this regard, the driving voltage of each circuit of the display driving device 10 may include a first level voltage, a first level middle-voltage, a second level middle-voltage and a first level high-voltage. The first level voltage means a low-voltage. Each of the first and second level middle-voltages may be a middle-voltage greater than the low-voltage. The second level middle-voltage may be the middle-voltage greater than the first level middle-voltage. The first level high-voltage means a high-voltage greater than the second level middle-voltage. For example, the low-voltage may be in a range of 0.9V to 2.2V, the middle-voltage may be in a range of 6V to 11V, and the high-voltage may be 12V or higher. Accordingly, the first level voltage may be in a range of 0.9V to 2.2V, each of the first level middle-voltage and the second level middle-voltage may be in a range of 6V to 11V, and the first level high-voltage may be 12V or higher.

Moreover, the power supply 65 supplies a power for driving the display panel 60 to the display panel 60 so that the display panel 60 may operate.

The display driving device 10 may be configured to include a timing control circuit 110 for controlling a gate driver circuit 120 and a data driver circuit 130 disposed in the display panel 60, the gate driver circuit 120 for controlling signals input to the gate lines GL1 to GLg, and the data driver circuit 130 for controlling signals input to the data lines DL1 to DLd disposed in the display panel 60.

In this regard, in FIG. 1, the display driving device 10 is illustrated as being mounted on the display panel 60. However, this is only an example, and the display driving device 10 may be separated from the display panel 60 and may be mounted on a separate board.

Moreover, the timing control circuit 110, the gate driver circuit 120, and the data driver circuit 130 constituting the display driving device 10 may constitute a single semiconductor device, or may be respectively composed of individual semiconductor devices.

Figure 2:
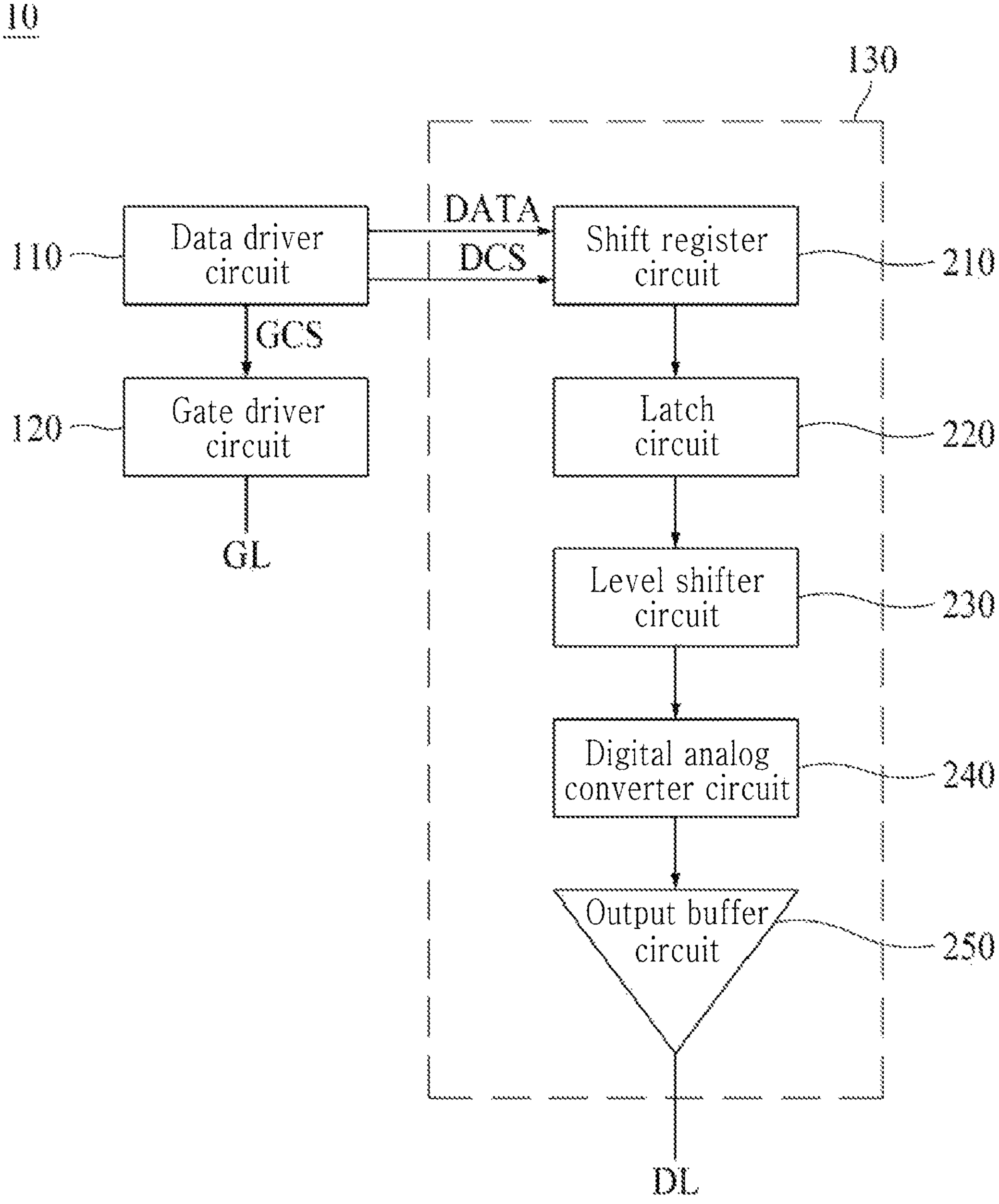
FIG. 2 is a block diagram of a display driving device according to an embodiment of the present disclosure.

Hereinafter, a display driving device according to an embodiment of the present disclosure will be described in detail with reference to FIG. 2. FIG. 2 is a diagram showing each of circuits constituting a display driving device according to an embodiment of the present disclosure.

As shown in FIG. 2, the timing control circuit 110 supplies a gate control signal GCS to the gate driver circuit 120 to control the gate driver circuit 120. Specifically, the timing control circuit 110 receives first image data and timing signals from the external system 80, generates the gate control signal GCS for controlling the gate driver circuit 120 based on the timing signals, and generates a data control signal DCS for controlling the data driver circuit 130.

In one embodiment, the timing control circuit 110 may generate the gate control signal GCS including a gate start pulse GSP, a gate shift clock GSC, and a gate output enable signal GOE, etc.

In one embodiment, the timing control circuit 110 may generate the data control signal DCS including a source start pulse SSP, a source sampling clock SSC, and a source output enable signal SOE, etc.

The timing control circuit 110 transfers the gate control signal GCS to the gate driver circuit 120 and transfers the data control signal DCS to the data driver circuit 130.

The timing control circuit 110 aligns the first image data received from the external system 80. Specifically, the timing control circuit 110 aligns the first image data so as to match a structure and characteristics of the display panel 60 to generate second image data DATA.

The timing control circuit 110 transfers the second image data DATA to the data driver circuit 130.

The gate driver circuit 120 outputs the gate signal synchronized with the source signals generated from the data driver circuit 130 to the gate lines GL1 to GLg according to the timing signals generated from the timing control circuit 110. Specifically, the gate driver circuit 120 outputs the gate signal synchronized with the source signals to the gate lines GL1 to GLg according to the gate start pulse, the gate shift clock, and the gate output enable signal generated from the timing control circuit 110.

The gate driver circuit 120 includes a gate shift register circuit, a gate level shifter circuit, etc. In this regard, the gate shift register circuit may be formed directly on a TFT array substrate of the display panel 60 in a GIP (Gate In Panel) process. In this case, the gate driver circuit 120 supplies the gate start pulse and the gate shift clock signal to the gate shift register circuit formed on the TFT array substrate in the GIP manner.

The data driver circuit 130 converts the second image data DATA into a source signal according to the timing signal generated from the timing control circuit 110. Specifically, the data driver circuit 130 converts the second image data into a source signal according to the source start pulse, the source sampling clock, and the source output enable signal. The data driver circuit 130 outputs the source signal corresponding to one horizontal line to the data lines DL1 to DLd every one horizontal period for which the gate signals are supplied to the gate lines GL1 to GLg.

In this regard, the data driver circuit 130 receives a gamma voltage from a gamma voltage generator (not shown), and may convert the second image data DATA into the source signal using the gamma voltage. To this end, the data driver circuit 130 includes a shift register circuit 210, a latch circuit 220, a level shifter circuit 230, a digital analog converter circuit 240, and an output buffer circuit 250 as shown in FIG. 2.

The shift register circuit 210 receives the source start pulse and the source sampling clock from the timing control circuit 110, sequentially shifts the source start pulse according to the source sampling clock to output a sampling signal. The shift register circuit 210 transfers the sampling signal to the latch circuit 220.

The latch circuit 220 sequentially samples and latches the second image data by a predetermined unit according to the sampling signal. The latch circuit 220 transfers the latched second image data to the level shifter circuit 230.

The level shifter circuit 230 amplifies a level of the latched second image data. Specifically, the level shifter circuit 230 amplifies the level of the second image data to a level which the digital-to-analog converter circuit 240 may deal with. The level shifter circuit 230 transfers the level-amplified second image data to the digital-to-analog converter circuit 240.

The digital-to-analog converter circuit 240 converts the second image data into an analog source signal. The digital-to-analog converter circuit 240 transfers the source signal as the analog signal to the output buffer circuit 250.

The output buffer circuit 250 outputs the source signal to data lines DL1 to DLd. Specifically, the output buffer circuit 250 buffers the source signal according to the source output enable signal generated from the timing control circuit 110 and outputs the buffered source signal to the data lines DL1 to DLd.

In this regard, each of the shifter register circuit 210 and the latch circuit 220 may receive the first level low-voltage, which is, for example, a low-voltage. Each of the level shifter circuit 230 and the digital-to-analog converter circuit 240 may receive, as the middle-voltage, the first level middle-voltage or the second level middle-voltage. That is, each of the shifter register circuit 210 and the latch circuit 220 may include a low-voltage element LV for receiving the first level low-voltage as a low-voltage. At least one of the level shifter circuit 230 and the digital-to-analog converter circuit 240 may include a first middle-voltage element MV1 or a second middle-voltage element MV2 for receiving the first level middle-voltage or the second level middle-voltage as the middle-voltage. Moreover, at least one of the level shifter circuit 230, the digital-to-analog converter circuit 240, and the output buffer circuit 250 may include a high-voltage element HV for receiving the first level high-voltage as a high-voltage.

According to an embodiment of the present disclosure, the second middle-voltage element MV2 included in at least one of the level shifter circuit 230 and the digital-to-analog converter circuit 240 may include a second-first middle-voltage well MV2_well1 and a second-second middle-voltage well MV2_well2 respectively doped with different types of dopants and has different widths; a second-first middle-voltage drift area MV2_LDD1 disposed between second-first middle-voltage well MV2_well1 and a second middle-voltage source area MV2_S; and a second-second middle-voltage drift area MV2_LDD2 disposed between the second-second middle-voltage well MV2_well2 and a second middle-voltage drain area MV2_D. Thus, the second middle-voltage element MV2 may operate in response to receiving the second level middle-voltage greater than the first level middle-voltage. Accordingly, a separate element which operates in response reception of the second level middle-voltage higher than the first level middle-voltage may be omitted, and thus, an area size of the circuit including the second middle-voltage element MV2 may be reduced.

Hereinafter, a semiconductor device according to an embodiment of the present disclosure will be described in detail with reference to FIGS. 3 and 4.

Figure 3:
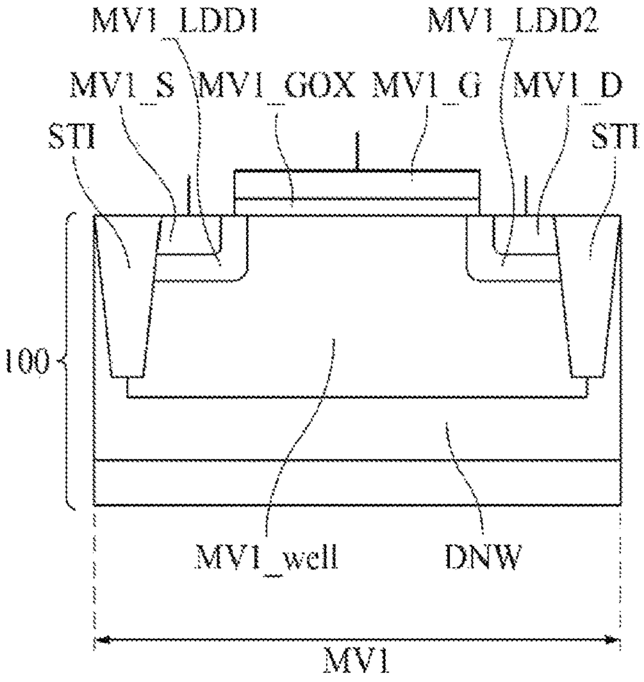
FIG. 3 is a cross-sectional view of a first middle-voltage element according to an embodiment of the present disclosure.

FIG. 3 is a cross-sectional view of the first middle-voltage element according to an embodiment of the present disclosure. FIG. 4 is a cross-sectional view of the second middle-voltage element according to an embodiment of the present disclosure.

The semiconductor device according to an embodiment of the present disclosure may include the first middle-voltage element MV1 for receiving the first level middle-voltage and the second middle-voltage element MV2 for receiving the second level middle-voltage higher than the first level middle-voltage, as described above.

Figure 4:
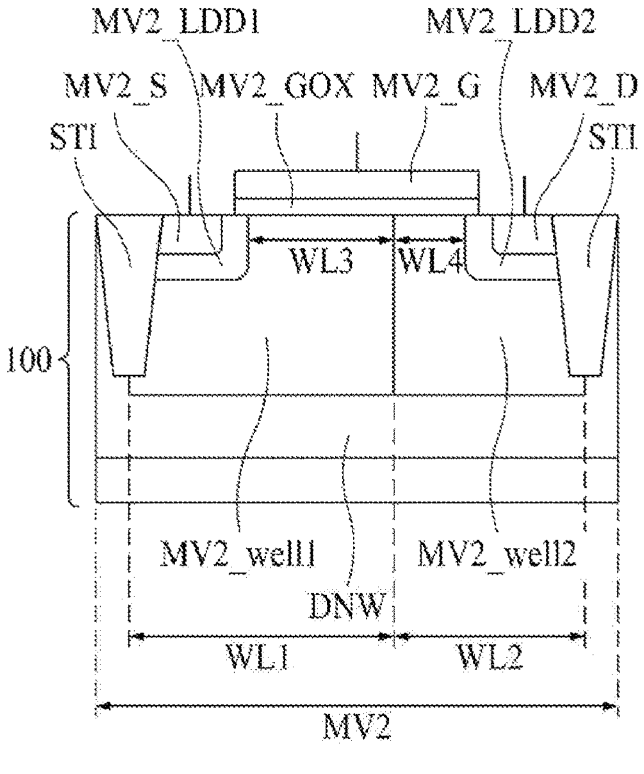
FIG. 4 is a cross-sectional view of a second middle-voltage element according to an embodiment of the present disclosure.

Referring to FIGS. 3 and 4, the first middle-voltage element MV1 and the second middle-voltage element MV2 may be positioned on a substrate 100.

The substrate 100 may include an elemental (single element) semiconductor such as silicon, germanium, and/or other suitable materials; a compound semiconductor such as silicon carbide, gallium arsenide, gallium phosphide, indium phosphide, indium arsenide, indium antimonide, and/or other suitable materials; or an alloy semiconductor such as SiGe, GaAsP, AlInAs, AlGaAs, GaInAs, GaInP, GaInAsP, and/or other suitable materials. The substrate 100 may be composed of a single material layer having a uniform composition. Alternatively, the substrate 100 may include multiple material layers of similar or different compositions suitable for IC device manufacturing. For example, the substrate 100 may include a silicon-on-insulator (SOI) having a silicon oxide layer and a silicon layer formed on the silicon oxide layer. Alternatively, the substrate 100 may include a conductive layer, a semiconductor layer, a dielectric layer, other layers, or combinations thereof.

The substrate 100 may be doped with an n-type dopant or a p-type dopant, and thus may contain the n-type dopant or the p-type dopant.

Moreover, the substrate 100 includes various doped areas disposed within or on the substrate 100. Each of the doped areas may be doped with the n-type dopants such as phosphorus or arsenic, and/or the p-type dopants such as boron or $BF_2$, depending on design requirements. Moreover, each of the doped areas may have a n-well structure such as a deep N well (DNW), a p-well structure such as a deep P well (DPW) or a dual-well structure. Each of the doped areas may be formed via implantation of dopant atoms, in-situ doped epitaxial growth, and/or other suitable techniques.

According to an embodiment of the present disclosure, the first middle-voltage element MV1 may operate in response to reception of the first level middle-voltage greater than the first level low-voltage. The second middle-voltage element MV2 may operate in response to reception of the second level middle-voltage greater than the first level middle-voltage.

The substrate 100 includes an isolation structure STI positioned within the substrate 100 so as to electrically isolate the elements from each other. To this end, the isolation structure STI may be disposed between the elements so as to define an area where each element is disposed. The isolation structure STI may be embodied as a shallow trench isolation (STI) structure.

The isolation structure STI may include a different dielectric material than that of the substrate 100. For example, the isolation structure STI may be made of a dielectric material including silicon dioxide, silicon nitride, silicon carbide, silicon oxycarbide, silicon oxynitride, another suitable dielectric material, or any combination thereof.

According to one embodiment of the present disclosure, as shown in FIG. 3, in the first middle-voltage element MV1, the substrate 100 includes a first middle-voltage well MV1_well, a first-first middle-voltage drift area MV1_LDD1, a first-second middle-voltage drift area MV1_LDD2, a first middle-voltage source area MV1_S, and a first middle-voltage drain area MV1_D as individually doped with the n-type or p-type dopant.

As shown in FIG. 3, the first middle-voltage well MV1_well may be an area in the deep well area as doped with the same type of dopant as the dopant doped into the deep well area. Specifically, the first middle-voltage well MV1_well may be an area in the deep N well DNW as doped with the n-type dopant as the first type dopant at a concentration different from that at which the deep N well is doped with the n-type dopant as the first type dopant. However, the present disclosure is not limited thereto. The first middle-voltage well MV1_well may be an area in the deep P well area as doped with the same type of dopant as the dopant doped into the deep P well area. Specifically, the first middle-voltage well MV1_well may be an area in the deep P well DPW as doped with the p-type dopant as the second type dopant at a concentration different from that at which the deep P well is doped with the p-type dopant as the second type dopant.

Moreover, according to an embodiment of the present disclosure, the first middle-voltage well MV1_well and the second-first middle-voltage well MV2_well1 may be formed using one mask, and thus may be doped with the same dopant at substantially the same concentration. That is, the first middle-voltage well MV1_well and the second-first middle-voltage well MV2_well1 may be doped with the first type dopant at a first well concentration. Accordingly, a separate mask for forming each of the first middle-voltage well MV1_well and the second-first middle-voltage well MV2_well1 is not required, thereby reducing a manufacturing cost of the semiconductor device.

Each of the first-first middle-voltage drift area MV1_LDD1 and the first-second middle-voltage drift area MV1_LDD2 may be present in the first middle-voltage well MV1_well doped with the first type dopant but may be doped with the second type dopant different from the first type dopant. For example, when the first middle-voltage well MV1_well is an area doped with the n-type dopant as the first type dopant, each of the first-first middle-voltage drift area MV1_LDD1 and the first-second middle-voltage drift area MV1_LDD2 may be doped with the p-type dopant as the second type dopant. However, the present disclosure is not limited thereto. when the first middle-voltage well MV1_well is an area doped with the p-type dopant as the second type dopant, each of the first-first middle-voltage drift area MV1_LDD1 and the first-second middle-voltage drift area MV1_LDD2 may be an area doped with the n-type dopant.

The first middle-voltage source area MV1_S may be an area doped with the same type of dopant as the type of the dopant doped into the first-first middle-voltage drift area MV1_LDD1. The first middle-voltage drain area MV1_D may be an area doped with the same type of dopant as the type of the dopant doped into the first-second middle-voltage drift area MV1_LDD2. The first middle-voltage source area MV1_S may be an area doped with the second type dopant and may be present in the first-first middle-voltage drift area MV1_LDD1 doped with the second type dopant. The first middle-voltage drain area MV1_D may be an area doped with the second type dopant and may be present in the first-second middle-voltage drift area MV1_LDD2 doped with the second type dopant. For example, when each of the first-first middle-voltage drift area MV1_LDD1 and the first-second middle-voltage drift area MV1_LDD2 is doped with the p-type conductor, each of the first middle-voltage source area MV1_S and the first middle-voltage drain area MV1_D may be an area doped with the p-type dopant.

A first middle-voltage gate dielectric layer MV1_GOX may be stacked on the substrate 100 so as to partially overlap each of the first-first middle-voltage drift area MV1_LDD1 and the first-second middle-voltage drift area MV1_LDD2.

The first middle-voltage gate dielectric layer MV1_GOX may be made of or include an oxide, such as silicon oxide, a nitride, such as silicon nitride, or a high dielectric constant (high-k) dielectric material. When the first middle-voltage gate dielectric layer MV1_GOX is stacked in a high-k gate process (high-k metal gate: HKMG), the first middle-voltage gate dielectric layer MV1_GOX may be made of or include the high-k dielectric material. For example, the high-k dielectric material may include hafnium oxide, lanthanum oxide, other suitable materials, or combinations thereof. Moreover, the first middle-voltage gate dielectric layer MV1_GOX may have a structure in which a plurality of layers are stacked, wherein the layers may be made of materials having different dielectric constants.

A first middle-voltage gate electrode MV1_G is stacked on the first middle-voltage gate dielectric layer MV1_GOX. The first middle-voltage gate electrode MV1_G may be made of or may include, for example, titanium nitride, tantalum nitride, titanium, tantalum, tungsten, aluminum, copper, other suitable conductive metal material, or any combination thereof. Alternatively, the first middle-voltage gate electrode MV1_G may be made of or include polysilicon, intrinsic polysilicon, doped polysilicon, or any combination thereof. Moreover, the first middle-voltage gate electrode MV1_G may have a structure in which a plurality of layers are stacked, wherein the layers may be made of metal materials of different conductivity types.

Moreover, although not shown, the first middle-voltage element MV1 may further include a diffusion barrier layer or a work-function layer. The diffusion barrier layer may be made of TiN (titanium nitride) which may or may not be doped with silicon. The work function layer may determine a work function of an individual gate, and may include at least one layer or a plurality of layers made of different materials.

Referring to FIG. 4, in the second middle-voltage element MV2, the substrate 100 includes the second-first middle-voltage well MV2_well1, the second-second middle-voltage well MV2_well2, the second-first middle-voltage drift area MV2_LDD1, the second-second middle-voltage drift area MV2_LDD2, the second middle-voltage source area MV2_S and the second middle-voltage drain area MV2_D as individually doped with the n-type or p-type dopant.

As shown in FIG. 4, the second-first middle-voltage well MV2_well1 and second-second middle-voltage well MV2_well2 may be formed in the deep N well DNW doped with the n-type dopant as the first type dopant doped into the substrate 100. However, the present disclosure is not limited thereto, and second-first middle-voltage well MV2_well1 and second-second middle-voltage well MV2_well2 may be formed in the deep P well of the substrate 100, and in this case, the first type dopant is the p-type dopant.

According to an embodiment of the present disclosure, the second-first middle-voltage well MV2_well1 and the second-second middle-voltage well MV2_well2 may be doped with different types of dopants. Specifically, the second-first middle-voltage well MV2_well1 may be an area doped with the first type dopant, while the second-second middle-voltage well MV2_well2 may be an area doped with the second type dopant different from the first type dopant. For example, as shown in FIG. 4, the second-first middle-voltage well MV2_well1 may be an area doped with the n-type dopant as the first type dopant. The second-second middle-voltage well MV2_well2 may be an area doped with the p-type dopant as the second type dopant.

According to an embodiment of the present disclosure, the second-first middle-voltage well MV2_well1 may have a larger width than that of the second-second middle-voltage well MV2_well2. Specifically, a first width WL1 of the second-first middle-voltage well MV2_well1 may be defined as a distance between a boundary between the isolation structure STI and the second-first middle-voltage well MV2_well1 and a boundary between the second-first middle-voltage well MV2_well1 and the second-second middle-voltage well MV2_well2. A second width WL2 of the second-second middle-voltage well MV2_well2 may be defined as a distance between the boundary between the second-second middle-voltage well MV2_well2 and the second-first middle-voltage well MV2_well1 and the boundary between the isolation structure STI and the second-second middle-voltage well MV2_well2. As shown in FIG. 4, the first width WL1 of the second-first middle-voltage well MV2_well1 may be greater than the second width WL2 of the second-second middle-voltage well MV2_well2 (WL1>WL2).

Moreover, according to an embodiment of the present disclosure, the second-first middle-voltage well MV2_well1 disposed between the second-first middle-voltage drift area MV2_LDD1 and the second-second middle-voltage drift area MV2_LDD2 may have a larger width than that of the second-second middle-voltage well MV2_well2 disposed between second-first middle-voltage drift area MV2_LDD1 and second-second middle-voltage drift area MV2_LDD2. Specifically, a third width WL3 of the second-first middle-voltage well MV2_well1 disposed between the second-first middle-voltage drift area MV2_LDD1 and the second-second middle-voltage drift area MV2_LDD2 may be defined as a distance from a boundary between the second-first middle-voltage drift area MV2_LDD1 and the second-first middle-voltage well MV2_well1 to a boundary between the second-first middle-voltage well MV2_well1 and the second-second middle-voltage well MV2_well2. A fourth width WL4 of the second-second middle-voltage well MV2_well2 disposed between the second-first middle-voltage drift area MV2_LDD1 and the second-second middle-voltage drift area MV2_LDD2 may be defined as a distance from a boundary between the second-first middle-voltage well MV1_well1 and the second-second middle-voltage well MV2_well2 to a boundary between the second-second middle-voltage drift area MV2_LDD2 and the second-second middle-voltage well MV2_well2. The third width WL3 of the second-first middle-voltage well MV2_well1 disposed between the second-first middle-voltage drift area MV2_LDD1 and the second-second middle-voltage drift area MV2_LDD2 may be greater than the fourth width WL4 of the second-second middle-voltage well MV2_well2 disposed between the second-first middle-voltage drift area MV2_LDD1 and the second-second middle-voltage drift area MV2_LDD2 (WL3>WL4). In this regard, the third width WL3 of the second-first middle-voltage well MV2_well1 disposed between the second-first middle-voltage drift area MV2_LDD1 and the second-second middle-voltage drift area MV2_LDD2 may be in a range of 0.6 times to 0.8 times of the distance between the second-first middle-voltage drift area MV2_LDD1 and the second-second middle-voltage drift area MV2_LDD2. The fourth width WL4 of the second-second middle-voltage well MV2_well2 disposed between the second-first middle-voltage drift area MV2_LDD1 and the second-second middle-voltage drift area MV2_LDD2 may have a value of 0.3 m or smaller.

Accordingly, the second middle-voltage element MV2 according to an embodiment of the present disclosure may operate without a separate element even when receiving the second level middle-voltage greater than the first level middle-voltage. Thus, the function of the second middle-voltage element MV2 may be carried out using a smaller area.

According to an embodiment of the present disclosure, the second-first middle-voltage well MV2_well1 and the first middle-voltage well MV1_well may be formed at the same time and may be doped with the same dopant at substantially the same concentration. For example, the first middle-voltage well MV1_well and the second-first middle-voltage well MV2_well1 may be doped with the n-type dopant at a first well concentration. However, the present disclosure is not limited thereto, and the first middle-voltage well MV1_well and second-first middle-voltage well MV2_well1 may be doped with the p-type dopant at the first well concentration.

The second-first middle-voltage drift area MV2_LDD1 may be an area doped with a dopant of a different type from that of the dopant doped into the second-first middle-voltage well MV2_well1. That is, the second-first middle-voltage drift area MV2_LDD1 may be an area doped with the second type dopant different from the first type dopant and may be present in the second-first middle-voltage well MV2_well1 doped with the first type dopant. For example, when the second-first middle-voltage well MV2_well1 is an area doped with the n-type dopant, the second-first middle-voltage drift area MV2_LDD1 may be an area doped with the p-type dopant. However, the present disclosure is not limited thereto, and when the second-first middle-voltage well MV2_well1 is an area doped with the p-type dopant, the second-first middle-voltage drift area MV2_LDD1 may be an area doped with the n-type dopant.

The second-second middle-voltage drift area MV2_LDD2 may be an area doped with the same type of dopant as the type of the dopant doped into the second-second middle-voltage well MV2_well2. That is, the second-second middle-voltage drift area MV2_LDD2 may be an area doped with the second type dopant and may be disposed in the second-second middle-voltage well MV2_well2 doped with the second type dopant. In this regard, the second-second middle-voltage drift area MV2_LDD2 may be an area doped with a different concentration from that at which the second-second middle-voltage well MV2_well2 is doped. For example, when the second-second middle-voltage well MV2_well2 is an area doped with the p-type dopant, the second-second middle-voltage drift area MV2_LDD2 may be an area doped with the p-type dopant. However, the present disclosure is not limited thereto. When the second-second middle-voltage well MV2_well2 is an area doped with the n-type dopant, the second-second middle-voltage drift area MV2_LDD2 may be an area doped with the n-type dopant.

The second middle-voltage element MV2 according to an embodiment of the present disclosure includes the second-first middle-voltage drift area MV2_LDD1 disposed between the second-first middle-voltage well MV2_well1 and the second middle-voltage source area MV2_S, and the second-second middle-voltage drift area MV2_LDD2 disposed between second-second middle-voltage well MV2_well2 and the second middle-voltage drain area MV2_D. Thus, the second middle-voltage element MV2 may operate in response to reception of the second level middle-voltage greater than the first level middle-voltage.

The second middle-voltage source area MV2_S may be an area doped with the same dopant of the same type as that of the dopant doped into the second-first middle-voltage drift area MV2_LDD1 and may be disposed in the second-first middle-voltage drift area MV2_LDD1. That is, the second middle-voltage source area MV2_S may be an area doped with the second type dopant and may be disposed in the second-first middle-voltage drift area MV2_LDD1 doped with the second type dopant. For example, when the second-first middle-voltage drift area MV2_LDD1 is an area doped with the p-type dopant, the second middle-voltage source area MV2_S may be an area disposed in the second-first middle-voltage drift area MV2_LDD1 and doped with the p-type dopant. However, the present disclosure is not limited thereto. When the second-first middle-voltage drift area MV2_LDD1 is an area doped with the n-type dopant, the second middle-voltage source area MV2_S may be doped with the n-type dopant and may be disposed in the second-first middle-voltage drift area MV2_LDD1.

The second middle-voltage drain area MV2_D may be an area doped with the same type of dopant as the type of the dopant doped into the second-second middle-voltage drift area MV2_LDD2. That is, the second middle-voltage drain area MV2_D may be an area doped with the second type dopant and may be disposed in the second-second middle-voltage drift area MV2_LDD2 doped with the second type dopant. For example, when the second-second middle-voltage drift area MV2_LDD2 is an area doped with the p-type dopant, the second middle-voltage drain area MV2_D may be an area doped with the p-type dopant and may be disposed in the second-second middle-voltage drift area MV2_LDD2. However, the present disclosure is not limited thereto. When the second-second middle-voltage drift area MV2_LDD2 is an area doped with the n-type dopant, the second middle-voltage drain area MV2_D may be an area doped with the n-type dopant and may be disposed in the second-second middle-voltage drift area MV2_LDD2.

The second middle-voltage gate dielectric layer MV2_GOX may be stacked on the substrate 100 so as to partially overlap each of the second-first middle-voltage drift area MV2_LDD1 and the second-second middle-voltage drift area MV2_LDD2.

The second middle-voltage gate dielectric layer MV2_GOX may be made of or may include an oxide, such as silicon oxide, a nitride, such as silicon nitride, and the high-k dielectric material, or the like. When the second middle-voltage gate dielectric layer MV2_GOX is stacked in a high-k gate process (high-k metal gate: HKMG), the second middle-voltage gate dielectric layer MV2_GOX may be made of the high-k dielectric material. For example, the high-k dielectric material may include hafnium oxide, lanthanum oxide, other suitable materials, or combinations thereof. Moreover, the second middle-voltage gate dielectric layer MV2_GOX may have a structure in which a plurality of layers are stacked, wherein the layers may be respectively made of materials having different dielectric constants.

The second middle-voltage gate electrode MV2_G is stacked on the second middle-voltage gate dielectric layer MV2_GOX. The second middle-voltage gate electrode MV2_G may be made of or may include, for example, titanium nitride, tantalum nitride, titanium, tantalum, tungsten, aluminum, copper, another suitable conductive metal material, or any combination thereof. Alternatively, the second middle-voltage gate electrode MV2_G may be made of or include polysilicon, intrinsic polysilicon, doped polysilicon, or any combination thereof. Moreover, the second middle-voltage gate electrode MV2_G may have a structure in which a plurality of layers are stacked, wherein the layers may be made of metal materials of different conductivity types.

The second middle-voltage gate electrode MV2_G covers an exposed portion of a top surface of the second-first middle-voltage well MV2_well1 and an exposed portion of a top surface of the second-second middle-voltage well MV2_well2. Accordingly, an area where the second middle-voltage gate electrode MV2_G and the second-first middle-voltage well MV2_well1 overlap each other may have a length greater than or equal to the aforementioned third width WL3. An area where the second middle-voltage gate electrode MV2_G and the second-second middle-voltage well MV2_well2 overlap each other may have a length greater than or equal to the aforementioned fourth width WL4. That is, accordingly, a length of the area where the second middle-voltage gate electrode MV2_G and the second-first middle-voltage well MV2_well1 overlap each other may be larger than a length of the area where the second middle-voltage gate electrode MV2_G and the second-second middle-voltage well MV2_well2 overlap each other. Moreover, although not shown, the second middle-voltage element MV2 may further include a diffusion barrier layer or a work-function layer. The diffusion barrier layer may be made of TiN (titanium nitride), which may or may not be doped with silicon. The work function layer may determine a work function of an individual gate and may include at least one layer or a plurality of layers made of different materials.

A method for manufacturing a semiconductor device according to an embodiment of the present disclosure is described in detail with reference to FIGS. 5 to 6E.

Figure 5:
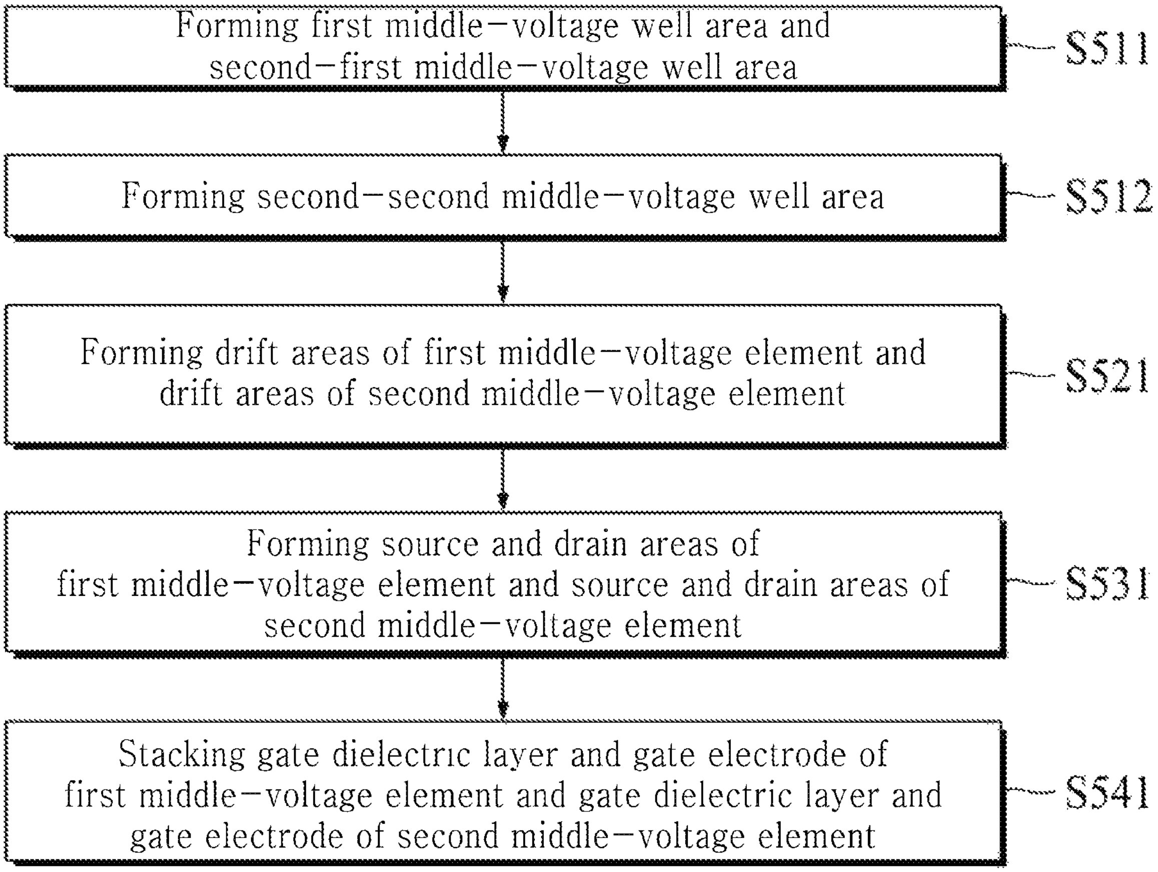
FIG. 5 is a flow chart of a method for manufacturing first and second middle-voltage elements according to an embodiment of the present disclosure.

FIG. 5 is a flow chart of a method for manufacturing the semiconductor device according to an embodiment of the present disclosure. FIG. 6A to FIG. 6E are diagrams of intermediate structures corresponding to intermediate steps of a method for manufacturing the semiconductor device according to an embodiment of the present disclosure.

Figure 6A:
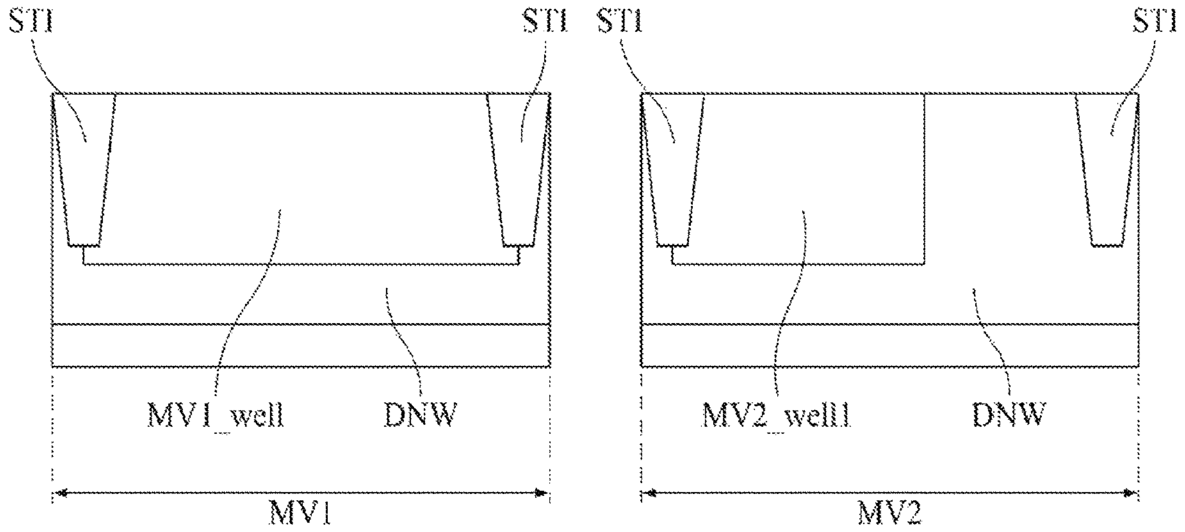
FIG. 6A to FIG. 6E are diagrams of intermediate structures corresponding to intermediate steps of a method for manufacturing first and second middle-voltage elements according to an embodiment of the present disclosure.

Referring to FIG. 5 and FIG. 6A, first, the first middle-voltage well MV1_well and the second-first middle-voltage well MV2_well1 are formed in the substrate 100 in S511. Specifically, as shown in FIG. 6A, in the substrate 100, each of an area where the first middle-voltage element MV1 is to be formed and an aera where the second middle-voltage element MV2 is to be formed is doped with the first type dopant as the n type or p type dopant. Thus, the first middle-voltage well MV1_well and the second-first middle-voltage well MV2_well1 are formed. In this regard, the first-middle voltage well MV1_well and the second-first middle-voltage well MV2_well1 may be formed through an ion implantation process using a mask.

According to an embodiment of the present disclosure, the first middle-voltage element MV1 and the second middle-voltage element MV2 may be formed in one substrate 100. In particular, the first middle-voltage well MV1_well and the second-first middle-voltage well MV2_well1 may be formed in the same process at the same time using one mask. Thus, a separate mask for each of the first middle-voltage well MV1_well and the second-first middle-voltage well MV2_well1 is not required. Thus, the manufacturing cost of the semiconductor device may be reduced.

According to an embodiment of the present disclosure, the first middle-voltage well MV1_well and the second-first middle-voltage well MV2_well1 may be doped with the same dopant and at substantially the same concentration. That is, the first middle-voltage well MV1_well and the second-first middle-voltage well MV2_well1 may be doped with the first type dopant at the first well concentration.

Moreover, according to an embodiment of the present disclosure, the first middle-voltage well MV1_well and the second-first middle-voltage well MV2_well1 may be doped with the same type of dopant as the dopant doped in the deep well area and may be disposed in the deep well area. For example, the first middle-voltage well MV1_well and the second-first middle-voltage well MV2_well1 may be doped with the n-type dopant and may be disposed in the deep N well doped with the n-type dopant. That is, the first middle-voltage well MV1_well and the second-first middle-voltage well MV2_well1 may be doped with the first type dopant and may be disposed in the deep well doped with the first type dopant. In this regard, the first middle-voltage well MV1_well and the second-first middle-voltage well MV2_well1 and the deep well may be doped at different concentrations.

Figure 6B:
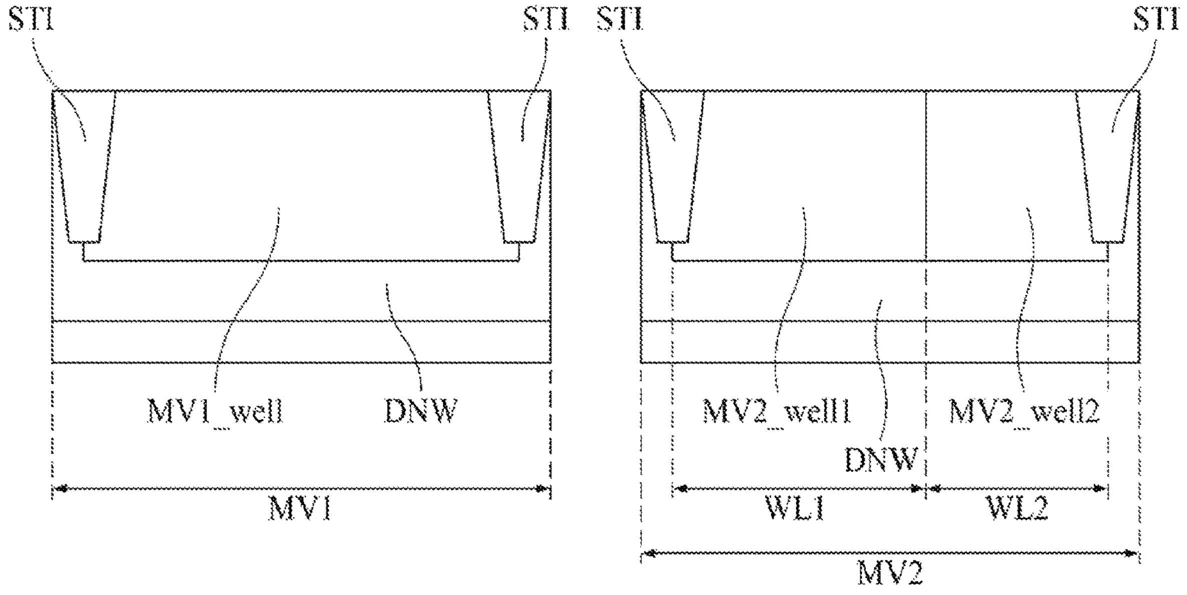

Then, the second-second middle-voltage well MV2_well2 is formed in the substrate 100 in S512. Specifically, as shown in FIG. 6B, the other side of the substrate 100 around a center of the area where the second middle-voltage element MV2 is to be formed other than one side thereof where the second-first middle-voltage well MV2_well1 has been formed is doped with the second type dopant, so that the second-second middle-voltage well MV2_well2 is formed. In this regard, the second-second middle-voltage well MV2_well2 may be formed through an ion implantation process using a mask. According to an embodiment of the present disclosure, the first middle-voltage element MV1, the second middle-voltage element MV2, and another element may be formed in one substrate 100. In particular, although not shown, the second-second middle-voltage well MV2_well2 is formed using a well of another element using one mask. Thus, a separate mask for each of the second-second middle-voltage well MV2_well2 and the well of another element is not required. Thus, the manufacturing cost of the semiconductor device may be reduced.

According to an embodiment of the present disclosure, the second-second middle-voltage well MV2_well2 may be an area disposed in the deep well area and doped with a dopant of a different type from that of the dopant doped into the deep well area. For example, the second-second middle-voltage well MV2_well2 may be an area doped with the p-type dopant and disposed in the deep N well doped with the n-type dopant. That is, the second-second middle-voltage well MV2_well2 may be an area doped with the second type dopant different from the first type dopant and disposed in the deep well doped with the first type dopant.

According to an embodiment of the present disclosure, the second-first middle-voltage well MV2_well1 may be formed to have a larger width than that of the second-second middle-voltage well MV2_well2. Specifically, the first width WL1 of the second-first middle-voltage well MV2_well1 may be defined as a distance between a boundary between the isolation structure STI and the second-first middle-voltage well MV2_well1 and a boundary between the second-first middle-voltage well MV2_well1 and the second-second middle-voltage well MV2_well2. The second width WL2 of the second-second middle-voltage well MV2_well2 may be defined as a distance between the boundary between the second-second middle-voltage well MV2_well2 and the second-first middle-voltage well MV2_well1 and the boundary between the isolation structure STI and the second-second middle-voltage well MV2_well2. As shown in FIG. 6B, the first width WL1 of the second-first middle-voltage well MV2_well1 may be greater than the second width WL2 of the second-second middle-voltage well MV2_well2 (WL1>WL2).

However, although the drawing shows that the first middle-voltage well MV1_well and the second-first middle-voltage well MV2_well1 are formed, and, then the second-second middle-voltage well MV2_well2 is formed, an order of the process is not limited thereto. Alternatively, the second-second middle-voltage well MV2_well2 may be formed, and then, the first middle-voltage well MV1_well and the second-first middle-voltage well MV2_well1 may be formed.

Figure 6C:
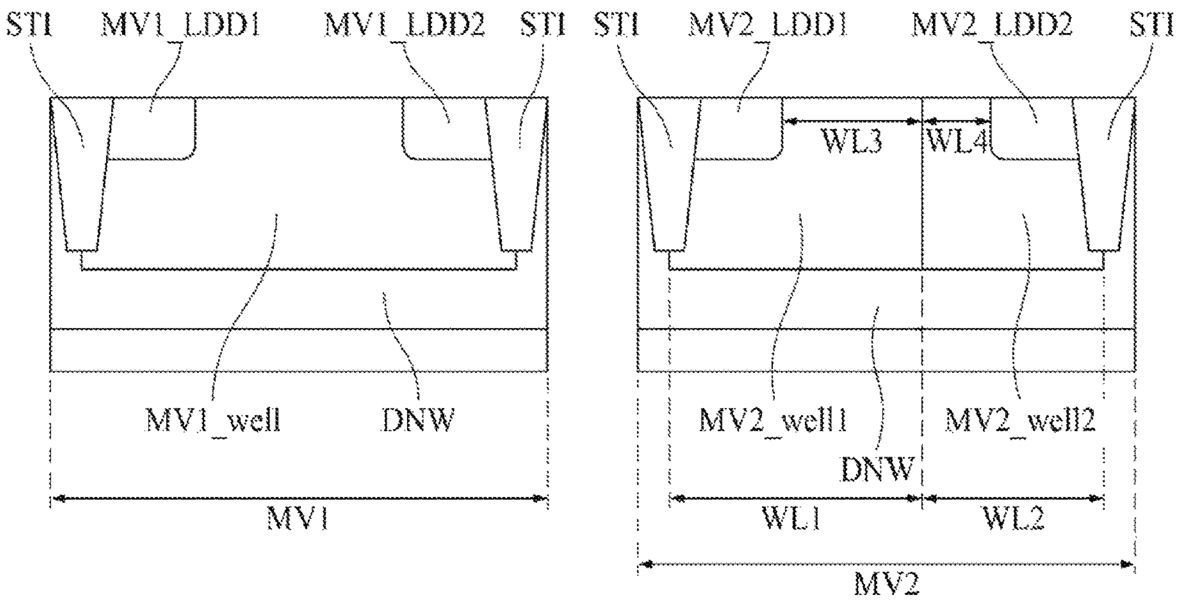

Subsequently, the drift areas MV1_LDD1 and MV1_LDD2 of the first middle-voltage element MV1 and the drift areas MV2_LDD1 and MV2_LDD2 of the second middle-voltage element MV2 are formed in the substrate 100 in S521. Specifically, as shown in FIG. 6C, the first-first middle-voltage drift area MV1_LDD1 and the first-second middle-voltage drift area MV1_LDD2 may be formed in the first middle-voltage well MV1_well by implanting a low concentration of dopant thereto so as to be spaced apart from each other while a middle area of the first middle-voltage well MV1_well is disposed therebetween. The second-first middle-voltage drift area MV2_LDD1 may be formed in the second-first middle-voltage well MV2_well1 in the substrate 100 by injecting a low-concentration dopant thereto so as to be spaced apart from the second-second middle-voltage well MV2_well2. The second-second middle-voltage drift area MV2_LDD2 may be formed in the second-second middle-voltage well MV2_well2 in the substrate 100 by injecting a low-concentration dopant thereto so as to be spaced apart from the second-first middle-voltage well MV2_well1.

According to an embodiment of the present disclosure, the first middle-voltage element MV1 and the second middle-voltage element MV2 may be formed in one substrate 100. In particular, the first-first middle-voltage drift area MV1_LDD1, the first-second middle-voltage drift area MV1_LDD2, the second-first middle-voltage drift area MV2_LDD1, and the second-second middle-voltage drift area MV2_LDD2 may be formed using one mask. Thus, separate masks therefor are not required. Thus, the manufacturing cost of the semiconductor device may be reduced.

According to an embodiment of the present disclosure, the first-first middle-voltage drift area MV1_LDD1 and the first-second middle-voltage drift area MV1_LDD2 may be doped with the dopant of a different type from the type of the dopant doped into the first middle-voltage well MV1_well. The second-first middle-voltage drift area MV2_LDD1 may be doped with the dopant of a different type from that of the dopant doped into the second-first middle-voltage well MV2_well1. On the contrary, the second-second middle-voltage drift area MV2_LDD2 may be an area doped with the same type of dopant as the type of the dopant doped into the second-second middle-voltage well MV2_well2. That is, the first middle-voltage well MV1_well and the second-first middle-voltage well MV2_well1 may be doped with the first type dopant. The first-first middle-voltage drift area MV1_LDD1, the first-second middle-voltage drift area MV1_LDD2 and the second-first middle-voltage drift area MV2_LDD1 may be doped with the second type dopant. The second-second middle-voltage well MV2_well2 may be doped with the second-type dopant. The second-second middle-voltage drift area MV2_LDD2 may be an area doped with the second type dopant.

According to an embodiment of the present disclosure, the second-first middle-voltage well MV2_well1 disposed between the second-first middle-voltage drift area MV2_LDD1 and the second-second middle-voltage drift area MV2_LDD2 may have a larger width than that of the second-second middle-voltage well MV2_well2 disposed between second-first middle-voltage drift area MV2_LDD1 and second-second middle-voltage drift area MV2_LDD2. Specifically, the third width WL3 of the second-first middle-voltage well MV2_well1 disposed between the second-first middle-voltage drift area MV2_LDD1 and the second-second middle-voltage drift area MV2_LDD2 may be defined as a distance from a boundary between the second-first middle-voltage drift area MV2_LDD1 and the second-first middle-voltage well MV2_well1 to a boundary between the second-first middle-voltage well MV2_well1 and the second-second middle-voltage well MV2_well2. The fourth width WL4 of the second-second middle-voltage well MV2_well2 disposed between the second-first middle-voltage drift area MV2_LDD1 and the second-second middle-voltage drift area MV2_LDD2 may be defined as a distance from a boundary between the second-first middle-voltage well MV2_well1 and the second-second middle-voltage well MV2_well2 to a boundary between the second-second middle-voltage drift area MV2_LDD2 and the second-second middle-voltage well MV2_well2. The third width WL3 of the second-first middle-voltage well MV2_well1 disposed between the second-first middle-voltage drift area MV2_LDD1 and the second-second middle-voltage drift area MV2_LDD2 may be greater than the fourth width WL4 of the second-second middle-voltage well MV2_well2 disposed between the second-first middle-voltage drift area MV2_LDD1 and the second-second middle-voltage drift area MV2_LDD2 (WL3>WL4). In this regard, the third width WL3 of the second-first middle-voltage well MV2_well1 disposed between the second-first middle-voltage drift area MV2_LDD1 and the second-second middle-voltage drift area MV2_LDD2 may be in a range of 0.6 times to 0.8 times of the distance between the second-first middle-voltage drift area MV2_LDD1 and the second-second middle-voltage drift area MV2_LDD2. The fourth width WL4 of the second-second middle-voltage well MV2_well2 disposed between the second-first middle-voltage drift area MV2_LDD1 and the second-second middle-voltage drift area MV2_LDD2 may have a value of 0.3 m or smaller.

Figure 6D:
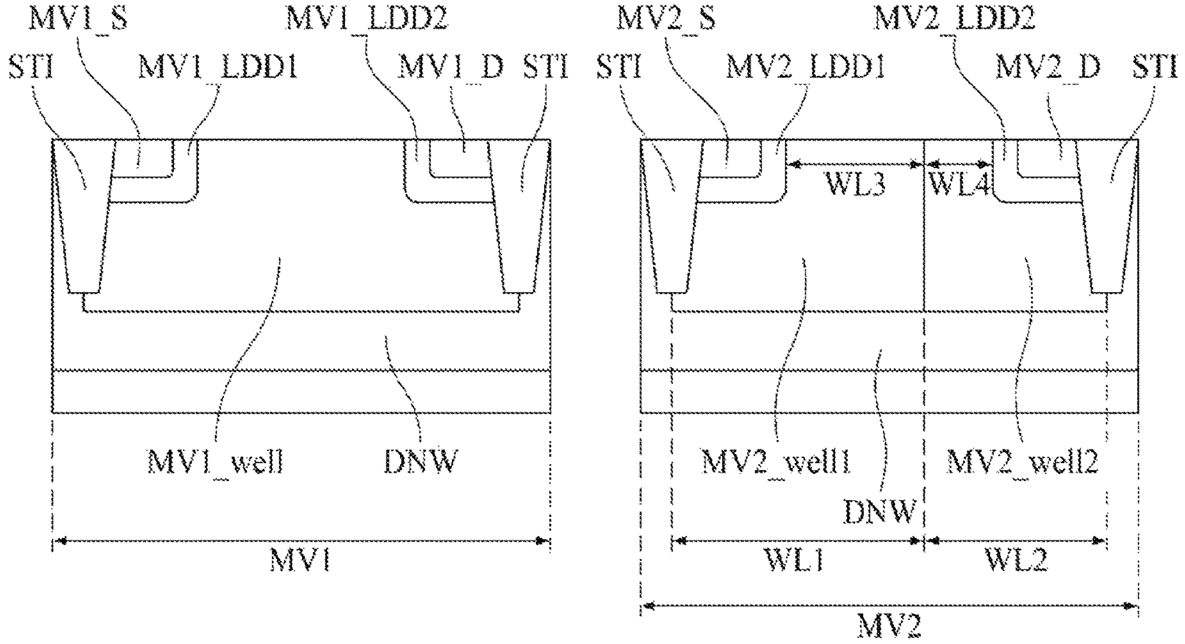
Figure 6E:
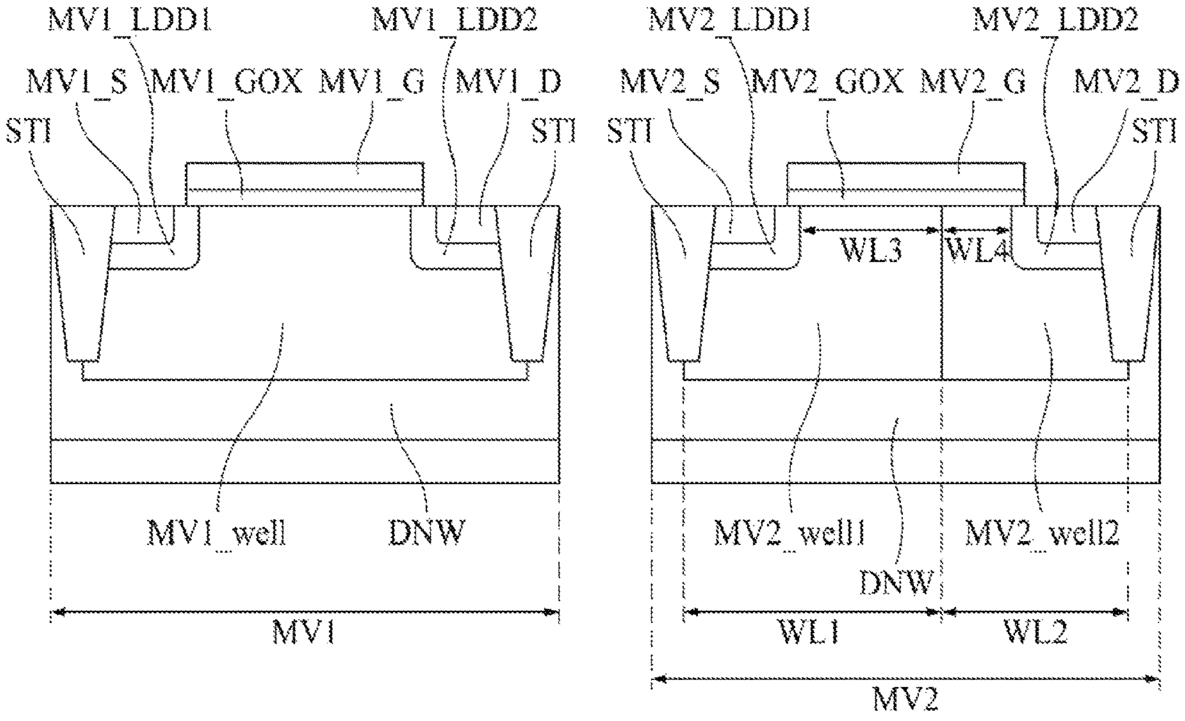

Then, the first middle-voltage source area MV1_S and the first middle-voltage drain area MV1_D and the second middle-voltage source area MV1_S and the second middle-voltage drain area MV1_D are formed in S531. Specifically, the first middle-voltage source area MV1_S, the first middle-voltage drain area MV1_D, the second middle-voltage source area MV2_S, and the second middle-voltage drain area MV2_D are formed by implanting the second type dopant. As shown in FIG. 6D, the first middle-voltage source area MV1_S and the first middle-voltage drain area MV1_D may be formed by implanting a high concentration of the second type dopant into the first-first middle-voltage drift area MV1_LDD1 and the first-second middle-voltage drift area MV1_LDD2, respectively. The second middle-voltage source area MV2_S and the second middle-voltage drain area MV2_D may be formed by implanting a high concentration of the second type dopant into the second-first middle-voltage drift area MV2_LDD1 and the second-second middle-voltage drift area MV2_LDD2, respectively.

According to an embodiment of the present disclosure, the first middle-voltage element MV1 and the second middle-voltage element MV2 may be formed in one substrate 100. The first middle-voltage source area MV1_S, the first middle-voltage drain area MV1_D, the second middle-voltage source area MV2_S, and the second middle-voltage drain area MV2_D may be simultaneously formed in one substrate 100 in the same process.

Subsequently, the gate dielectric layers MV1_GOX and MV2_GOX and the gate electrodes MV1_G and MV2_G of the first middle-voltage element MV1 and the second middle-voltage element MV2 are respectively sequentially stacked in S541. Specifically, as shown in FIG. 6E, the first middle-voltage gate dielectric layer MV1_GOX is stacked on the substrate 100 so as to partially overlap each of the first-first middle-voltage drift area MV1_LDD1 and the first-second middle-voltage drift area MV1_LDD2. The first middle-voltage gate electrode MV1_G is stacked on the first middle-voltage gate dielectric layer MV1_GOX. Moreover, the second middle-voltage gate dielectric layer MV2_GOX is stacked on the substrate 100 so as to partially overlap each of the second-first middle-voltage drift area MV2_LDD1 and the second-second middle-voltage drift area MV2_LDD2. The second middle-voltage gate electrode MV2_G is stacked on the second middle-voltage gate dielectric layer MV2_GOX.

According to an embodiment of the present disclosure, the first middle-voltage element MV1 and the second middle-voltage element MV2 may be formed in one substrate 100. The gate dielectric layers MV1_GOX and MV2_GOX and the gate electrodes MV1_G and MV2_G of the first middle-voltage element MV1 and the second middle-voltage element MV2 may be respectively simultaneously formed on one substrate 100 in the same process.

It will be appreciated by those skilled in the art to which the present disclosure belongs that the disclosure as described above may be practiced in other specific forms without altering its technical ideas or essential features.

It should therefore be understood that the embodiments as described above are illustrative and non-limiting in all respects. The scope of the present disclosure is defined by the appended claims, rather than by the detailed description above, and should be construed to cover all modifications or variations derived from the meaning and scope of the appended claims and the equivalents thereof.

What is claimed is:

1. A display device comprising:

a display panel for displaying an image through at least one pixel connected to a gate line and a data line;

a display driving device including:

a timing control circuit configured to output a gate control signal and a data control signal using a signal input from an external system;

a gate driver circuit configured to output a gate signal to the gate line using the gate control signal; and a data driver circuit configured to output a source signal to the data line using the data control signal; and a power supply for supplying power to the display panel and the display driving device, wherein the data driver circuit includes:

a first middle-voltage element disposed in a substrate and configured to receive a first level middle-voltage; and a second middle-voltage element disposed in the substrate and configured to receive a second level middle-voltage greater than the first level middle-voltage; and wherein the second middle-voltage element includes:

a second-first middle-voltage well doped with a first type dopant; and a second-second middle-voltage well doped with a second type dopant different from the first type dopant.

2. The display device of claim 1, wherein the first middle-voltage element includes a first middle-voltage well doped with the first type dopant.

3. The display device of claim 1, wherein a first width of the second-first middle-voltage well is greater than a second width of the second-second middle-voltage well.

4. The display device of claim 1, wherein the second middle-voltage element further includes:

a second-first middle-voltage drift area doped with the second type dopant; and a second-second middle-voltage drift area doped with the second type dopant.

5. The display device of claim 4, wherein a third width of the second-first middle-voltage well disposed between the second-first middle-voltage drift area and the second-second middle-voltage drift area is greater than a fourth width of the second-second middle-voltage well disposed between the second-first middle-voltage drift area and the second-second middle-voltage drift area.

6. The display device of claim 4, wherein a third width of the second-first middle-voltage well disposed between the second-first middle-voltage drift area and the second-second middle-voltage drift area is in a range of 0.6 times to 0.8 times of a distance between the second-first middle-voltage drift area and the second-second middle-voltage drift area.

* * * * *